(12) United States Patent
Lee (10) Patent No.: US 10,861,410 B2
(45) Date of Patent: Dec. 8, 2020

(54) DISPLAY DEVICE HAVING GATE DRIVING CIRCUIT

(71) Applicant: SAMSUNG DISPLAY CO., LTD., Yongin-si (KR)

(72) Inventor: Chang-soo Lee, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 9 days.

(21) Appl. No.: 16/168,878

(22) Filed: Oct. 24, 2018

(65) Prior Publication Data

US 2019/0130866 A1    May 2, 2019

(30) Foreign Application Priority Data

Oct. 26, 2017 (KR) .................. 10-2017-0140499

(51) Int. Cl.
| | | |
|---|---|---|
| *G09G 3/3266* | (2016.01) | |
| *G09G 5/00* | (2006.01) | |
| *G09G 3/36* | (2006.01) | |
| *G11C 19/28* | (2006.01) | |
| *G09G 3/34* | (2006.01) | |
| *G09G 3/3275* | (2016.01) | |

(52) U.S. Cl.
CPC ............ *G09G 5/003* (2013.01); *G09G 3/3266* (2013.01); *G09G 3/3677* (2013.01); *G09G 3/3696* (2013.01); *G11C 19/28* (2013.01); *G09G 3/3275* (2013.01); *G09G 3/344* (2013.01); *G09G 3/3688* (2013.01); *G09G 2300/0426* (2013.01); *G09G 2300/0439* (2013.01); *G09G 2310/0243* (2013.01); *G09G 2310/0267* (2013.01); *G09G 2310/0286* (2013.01); *G09G 2310/08* (2013.01); *G09G 2320/041* (2013.01); *G09G 2320/08* (2013.01); *G09G 2330/028* (2013.01)

(58) Field of Classification Search
CPC ... G09G 2310/0286; G09G 2310/0267; G09G 3/3696; G09G 3/3677; G09G 3/3266; G11C 27/04
See application file for complete search history.

(56) References Cited

U.S. PATENT DOCUMENTS

| | | |
|---|---|---|
| 8,643,584 B2 | 2/2014 | Han et al. |
| 8,723,844 B2 | 5/2014 | Ko |
| 9,858,842 B2 | 1/2018 | Hwang |

(Continued)

FOREIGN PATENT DOCUMENTS

| | | |
|---|---|---|
| KR | 10-1520807 | 5/2010 |
| KR | 10-2016-0043602 | 4/2016 |

(Continued)

*Primary Examiner* — Yuzhen Shen
(74) *Attorney, Agent, or Firm* — F. Chau & Associates, LLC (57) ABSTRACT

A display device includes a voltage generation circuit that generates a plurality of clock signals and a first driving voltage, a second driving voltage, and a third driving voltage. A gate driving circuit receives the generated clock signals and the first driving voltage, the second driving voltage, and the third driving voltage, and includes a plurality of driving stages each of which outputs a carry signal and a gate signal to a corresponding gate line among gate lines. The voltage generation circuit sets a voltage level of the third driving voltage based on a signal of a first node of at least one of the driving stages.

12 Claims, 8 Drawing Sheets

(56) References Cited

U.S. PATENT DOCUMENTS

| | | | | |
|---|---|---|---|---|
| 2014/0267214 A1* | 9/2014 | Hwang | ................ | G09G 3/2092 |
| | | | | 345/212 |
| 2015/0077407 A1* | 3/2015 | Kim | ..................... | G09G 3/3611 |
| | | | | 345/204 |
| 2015/0206490 A1* | 7/2015 | Lim | ..................... | G09G 3/3677 |
| | | | | 345/92 |
| 2016/0133212 A1 | 5/2016 | Jung et al. | | |

FOREIGN PATENT DOCUMENTS

| KR | 10-2016-0055368 | 5/2016 |
|---|---|---|
| KR | 10-1641312 | 7/2016 |
| KR | 10-2017-0028000 | 3/2017 |

* cited by examiner

DISPLAY DEVICE HAVING GATE DRIVING CIRCUIT

CROSS-REFERENCE TO RELATED APPLICATION

This U.S. non-provisional patent application claims priority under 35 U.S.C. § 119 from Korean Patent Application No. 10-2017-0140499, filed on Oct. 26, 2017, the contents of which are incorporated by reference herein in its entirety.

TECHNICAL FIELD

Embodiments of the inventive concept relate to a display device having a gate driving circuit that drives gate lines of a display panel.

DISCUSSION OF THE RELATED ART

A display device includes gate lines, data lines, and pixels connected to the gate lines and the data lines. The display device also includes a gate driving circuit to apply gate signals to the gate lines and a data driving circuit to apply data signals to the data lines.

The gate driving circuit includes a shift register including driving stage circuits (hereinafter, referred to as "driving stages"). Each driving stage applies a corresponding gate signal among the gate signals to a corresponding gate line among the gate lines. Each driving stage includes transistors connected to each other via an organic material. When the driving stages are operated for an extended period of time at an operating temperature, a threshold voltage of each driving stage may vary, causing some of the transistors to be turned-on at a weak (e.g. a low power) operating state. However, transistors that are inadvertently turned-on in this manner can influence the voltage levels of gate signals of the driving stages.

SUMMARY

Embodiments of the inventive concept provide a display apparatus that may increase reliability of a gate driving circuit thereof.

A display device according to one or more embodiments of the inventive concept may include a display panel comprising a plurality of gate lines, a plurality of data lines, and a plurality of pixels each being connected to a corresponding gate line among the gate lines and a corresponding data line among the data lines; a voltage generation circuit that generates voltages including a plurality of clock signals and a first driving voltage, second driving voltage, and third driving voltage; a gate driving circuit that receives the clock signals and the first driving voltage, second driving voltage, and third driving voltage and comprises a plurality of driving stages each of which outputs a carry signal and a gate signal to a corresponding gate line among the gate lines; and a data driving circuit that drives the data lines, a k-th (k is a natural number) driving stage among the plurality of driving stages including: a control circuit that applies a previous carry signal to a first node of one of the plurality of driving stages in response to a previous carry signal output from a previous driving stage. An output circuit that outputs a first clock signal among the clock signals as a k-th gate signal and a k-th carry signal in response to a signal of the first node, and a discharge hold circuit that applies one of the first clock signal and the first driving voltage to a second node in response to the first clock signal and the k-th carry signal. A first discharge circuit that discharges the first node to the third driving voltage in response to a signal of the second node and to discharge the second node to the second driving voltage in response to the previous carry signal, wherein the voltage generation circuit sets a voltage level of the third driving voltage based on the signal of the first node of at least one of the plurality of driving stages.

According to an embodiment of the inventive concept, the voltage generation circuit generates the third driving voltage based on a difference value between the signal of the first node, which is provided from the gate driving circuit, and a reference voltage.

According to an embodiment of the inventive concept, the voltage generation circuit generates the third driving voltage having a first level when the difference value is smaller than (e.g., less than) a first reference value and generates the third driving voltage having a second level less than the first level when the difference value is greater than the first reference value and less than a second reference value.

According to an embodiment of the inventive concept, the voltage generation circuit includes a comparator circuit comparing the signal of the first node with a reference voltage to output a selection signal corresponding to a difference value between the signal of the first node and the reference voltage, a look-up table outputting a voltage level signal corresponding to the selection signal, and a voltage generator outputting the third driving voltage corresponding to the voltage level signal.

According to an embodiment of the inventive concept, the comparator circuit outputs the selection signal having a first value when the difference value is less than a first reference value and outputs the selection signal having a second value when the difference value is greater than the first reference value and less than a second reference value.

According to an embodiment of the inventive concept, the look-up table has a memory interface outputs the voltage level signal in which the third driving voltage having a first level is output by the voltage generator when the selection signal has the first value and outputs the voltage level signal in which the third driving voltage having a second level is output by the voltage generator when the selection signal has the second value, and the second level of the third driving voltage is less than the first level of the third driving voltage.

According to an embodiment of the inventive concept, the voltage generator further generates the first and second driving voltages and the clock signals.

According to an embodiment of the inventive concept, the comparator circuit includes a counter that performs a counting operation in synchronization with a vertical start signal and one of the clock signals, and the comparator circuit does not output the selection signal when the counted value is a predetermined value.

According to an embodiment of the inventive concept, the second driving voltage has a voltage level less than the first driving voltage, and the third driving voltage has a voltage level equal to or less than the second driving voltage.

According to an embodiment of the inventive concept, the k-th driving stage includes a second discharge circuit discharging the k-th carry signal to the second driving voltage in response to the signal of the second node and a third discharge circuit discharging the k-th gate signal to the first driving voltage in response to the signal of the second node.

According to an embodiment of the inventive concept, the voltage generation circuit sets the voltage level of the third driving voltage based on the signal of the first node of a last driving stage of the driving stages.

Embodiments of the inventive concept provide a display device including a display panel including a plurality of gate lines, a plurality of data lines, and a plurality of pixels each being connected to a corresponding gate line among the gate lines and a corresponding data line among the data lines, a voltage generation circuit generating a plurality of clock signals and first, second, and third driving voltages. A gate driving circuit receiving the clock signals and the first, second, and third driving voltages and including a plurality of driving stages each of which outputs a carry signal and a gate signal to a corresponding gate line among the gate lines, and a data driving circuit driving the data lines. A k-th (k is a natural number) driving stage among the driving stages includes a control circuit applies a previous carry signal to a first node in response to the previous carry signal output from a previous driving stage, an output circuit outputting a first clock signal among the clock signals as a k-th gate signal and a k-th carry signal in response to a signal of the first node, a discharge hold circuit applying one of the first clock signal and the first driving voltage to a second node in response to the first clock signal and the k-th carry signal, and a first discharge circuit discharging the first node to the third driving voltage in response to a signal of the second node and discharging the second node to the second driving voltage in response to the previous carry signal. The voltage generation circuit sets a voltage level of the third driving voltage based on the gate signal output from at least one driving stage of the driving stages.

According to an embodiment of the inventive concept, the voltage generation circuit generates the third driving voltage based on a difference value between the gate signal provided from the gate driving circuit and a reference voltage.

According to an embodiment of the inventive concept, the voltage generation circuit generates the third driving voltage having a first level when the difference value is less than a first reference value and generates the third driving voltage having a second level less than the first level when the difference value is greater than the first reference value and less than a second reference value.

According to an embodiment of the inventive concept, the voltage generation circuit includes a comparator circuit comparing the gate signal provided from the gate driving circuit with a reference voltage to output a selection signal corresponding to a difference value between the signal of the first node and the reference voltage, a look-up table outputting a voltage level signal corresponding to the selection signal, and a voltage generator outputting the third driving voltage corresponding to the voltage level signal.

According to an embodiment of the inventive concept, the voltage generator further generates the first and second driving voltages and the clock signals.

According to an embodiment of the inventive concept, the second driving voltage has a voltage level less than the first driving voltage, and the third driving voltage has a voltage level equal to or less than the second driving voltage.

According to an embodiment of the inventive concept, the voltage generation circuit sets the voltage level of the third driving voltage based on the gate signal output from a last driving stage of the driving stages.

According to an embodiment of the inventive concept, in a case where the voltage of the first node of the driving stage of the gate driving circuit abnormally rises, the display device may discharge the voltage of the first node to the third driving voltage less than the second driving voltage. Since the voltage of the first node is stabilized, the reliability of the gate driving circuit is increased.

In an embodiment of the inventive concept, a display device includes a display panel comprising a plurality of gate lines, a plurality of data lines, and a plurality of pixels each being connected to a corresponding gate line among the gate lines and a corresponding data line among the data lines. A data driving circuit that drives the data lines for at least one driving stage among a plurality of driving stages. A voltage generation circuit generates a plurality of clock signals and at least a first driving voltage, a second driving voltage, and a third driving voltage, each of the at least the first driving voltage, the second driving voltage, and the third driving voltage have different voltage levels from each other. The third driving voltage controls at least a first output transistor and a second output transistor of the at least one driving stage; a gate driving circuit that includes a plurality of driving stages each of which outputs a carry signal and a gate signal to a corresponding gate line among the gate lines, receives the clock signals and the at least the first driving voltage, the second driving voltage, and the third driving voltage, and outputs a first voltage signal to the voltage generation circuit that indicates gate control voltage of at least the first output transistor and the second output transistor; and the voltage generation circuit sets a level of the third driving voltage based on the first voltage signal being output from the gate driving circuit, and wherein the level of the third driving voltage is decreased to discharge a gate voltage of at least one or more of the first output transistor and the second output transistor.

In an embodiment of the inventive concept, a display device may further include at least one discharge transistor connected to a first electrode of the third driving voltage and to a second electrode of the second driving voltage, wherein the at least one discharge transistor discharges a gate voltage of at least the one or more of the first output transistor and the second output transistor to the first electrode of the third driving voltage.

In an embodiment of the inventive concept, a display device may further include a timing control circuit that receives an image signal and a control signal from an external source, and applies a first control signal to the data driving circuit, a second control signal to the gate driving circuit, and a vertical start signal to the voltage generation circuit.

BRIEF DESCRIPTION OF THE DRAWINGS

The embodiments of the inventive concept will become better-appreciated by a person of ordinary skill in the art with reference to the following detailed description when considered in conjunction with the accompanying drawings wherein.

DETAILED DESCRIPTION OF THE EMBODIMENTS

Figure 1:
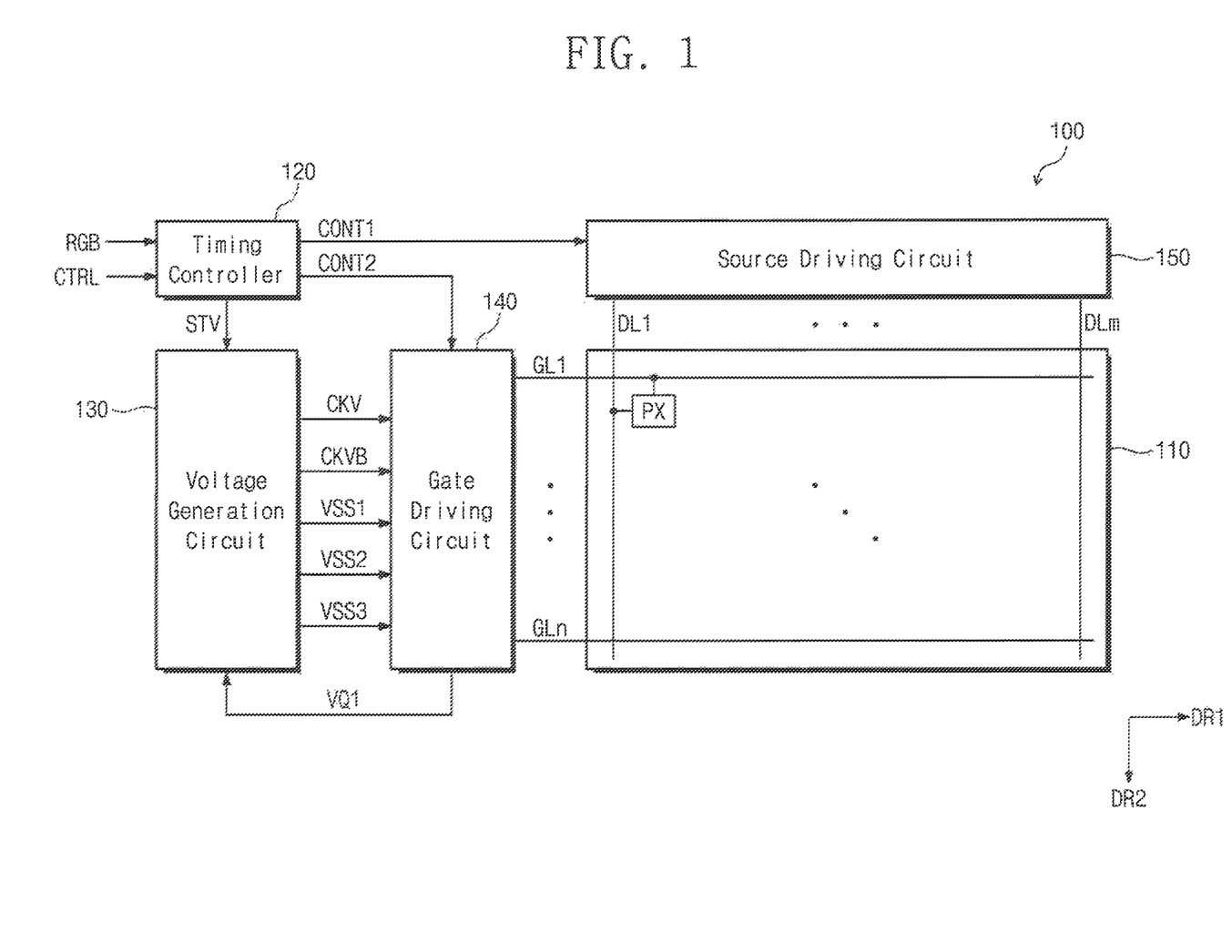
FIG. 1 is a block diagram showing a display device according to an exemplary embodiment of the inventive concept.

FIG. 1 is a block diagram showing a display device 100 according to an exemplary embodiment of the inventive concept.

Figure 2:
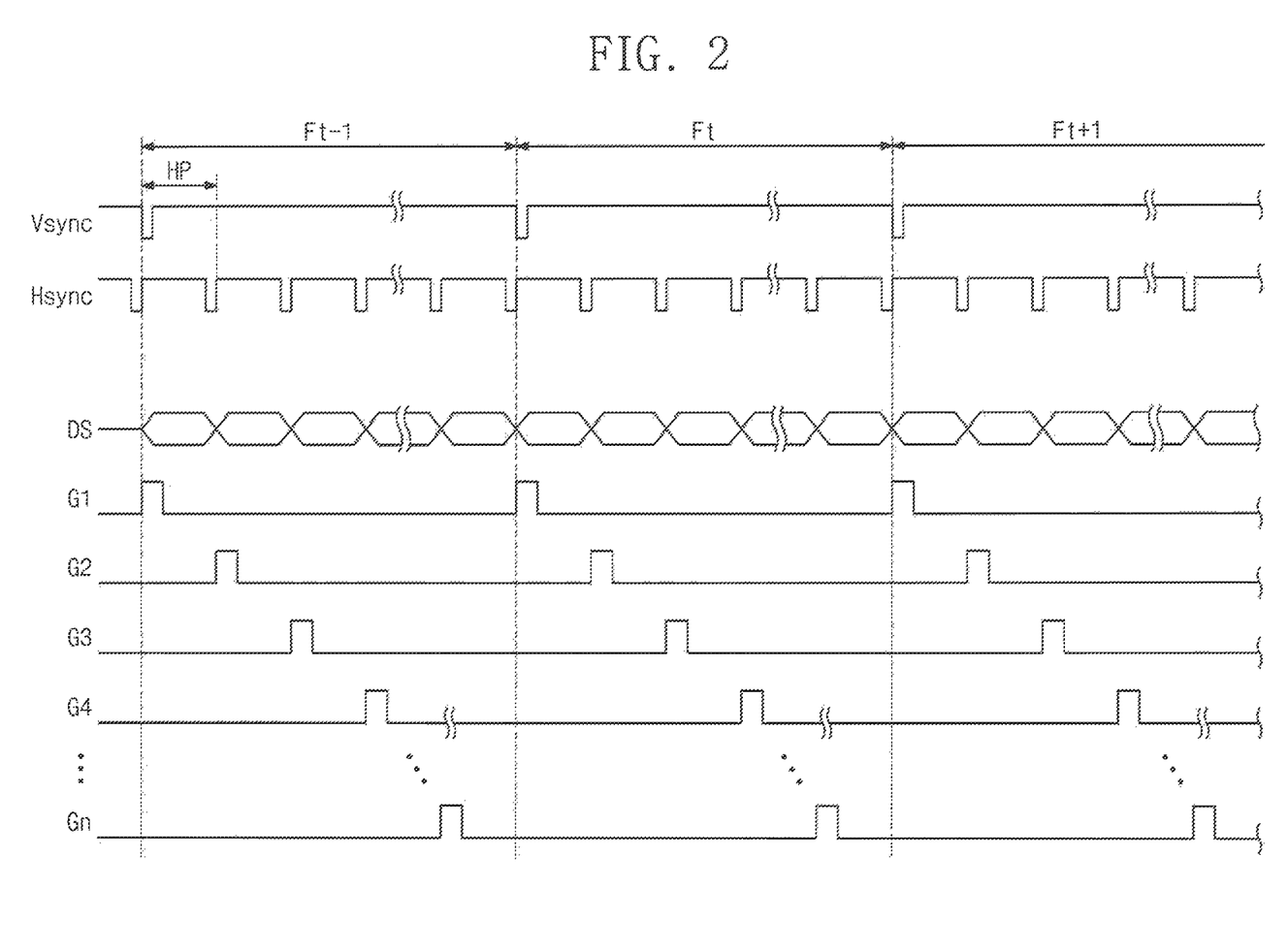
FIG. 2 is a timing diagram showing signals generated by a display device according to an exemplary embodiment of the inventive concept.

FIG. 2 is a timing diagram showing signals generated by the display device according to an exemplary embodiment of the inventive concept.

Referring to FIGS. 1 and 2, the display device 100 according to the exemplary embodiment of the inventive concept includes a display panel 110, a timing controller 120, a voltage generation circuit 130, a gate driving circuit 140, and a source driving circuit 150.

The display panel 110 may be one of various types of display panels, for example, a liquid crystal display panel, an organic light emitting display panel, an electrophoretic display panel, an electrowetting display panel, etc. In a case where the display panel 110 is the liquid crystal display panel, the display device 100 may further include a backlight unit (not shown) to provide a light to the display panel 110.

The display panel 110 includes a plurality of data lines DL1 to DLm, a plurality of gate lines GL1 to GLn crossing the data lines DL1 to DLm, and a plurality of pixels PX arranged in areas defined by the data lines DL1 to DLm and the gate lines GL1 to GLn. The gate lines GL1 to GLn extend from the gate driving circuit 140 in a first direction DR1, and are sequentially arranged in a second direction DR2. The data lines DL1 to DLm extend from the source driving circuit 150 in the second direction DR2, and are sequentially arranged in the first direction DR1. The data lines DL1 to DLm are insulated from the gate lines GL1 to GLn.

Although not shown in figures, each of the pixels includes a switching transistor connected to a corresponding data line from among the data lines DL1 to DLm and a corresponding gate line from among the gate lines GL1 to GLn, a liquid crystal capacitor connected to the switching transistor, and a storage capacitor connected to the switching transistor.

With continued reference to FIG. 1, the timing controller 120 receives an image signal RGB and a control signal CTRL from an external source (not shown). The timing controller 120 applies a first control signal CONT1 to the source driving circuit 150, applies a second control signal CONT2 to the gate driving circuit 140, and applies a vertical start signal STV to the voltage generation circuit 130. The timing controller 120 may apply the first control signal CONT1 to the source driving circuit 150 in a clock embedded interface manner. The first control signal CONT1 includes an image data signal, a horizontal synchronization signal Hsync distinguishing horizontal periods HP, and a clock signal. The first control signal CONT1 may further include a polarity control signal and a load signal.

The source driving circuit 150 drives the data lines DL1 to DLm in response to receiving the first control signal CONT1 from the timing controller 120. The source driving circuit 150 may be electrically connected to, for example, one side portion of the display panel 110, or the source driving circuit 150 may be directly mounted on the display panel 110 after being implemented in an independent integrated circuit. In addition, the source driving circuit 150 may be implemented in a single chip or may include a plurality of chips.

The gate driving circuit 140 drives the gate lines GL1 to GLn in response to the second control signal CONT2 from the timing controller 120. The second control signal CONT2 includes a vertical synchronization signal Vsync distinguishing frame periods Ft−1, Ft, and Ft+1 (FIG. 2). The gate driving circuit 140 generates gate signals G1 to Gn based on the second control signal CONT2 provided from the timing controller 120 during the frame periods Ft−1, Ft, and Ft+1 and applies the gate signals G1 to Gn to the gate lines GL1 to GLn. The gate signals G1 to Gn are sequentially output corresponding to the horizontal periods HP.

The gate driving circuit 140 may be electrically connected to one side portion of the display panel 110 after being implemented in an independent integrated circuit. In addition, the gate driving circuit 140 may be integrated in a predetermined area of the display panel 110 after being implemented in a circuit with an amorphous silicon gate (ASG) using an amorphous silicon thin film transistor (a-Si TFT), an oxide semiconductor, a crystalline semiconductor, a polycrystalline semiconductor, or the like. According to another embodiment of the inventive concept, the gate driving circuit 140 may be connected to the display panel 110 after being implemented in a chip-on-flexible printed circuit (COF), a chip-on-glass (COG), or a flexible printed circuit (FPC).

Switching transistors respectively corresponding to the pixels arranged in one row and connected to one gate line among the gate lines GL1 to GLn may be turned-on while a gate-on voltage is applied to the one gate line among the gate lines GL to GLn. In this case, the source driving circuit 150 applies data driving signals corresponding to the image data signal included in the first control signal CONT1 to the data lines DL1 to DLm. The data driving signals applied to the data lines DL1 to DLm are applied to the pixels PX through the turned-on switching transistors.

The voltage generation circuit 130 receives the vertical start signal STV from the timing controller 120 and generates a first clock signal CKV, a second clock signal CKVB, a first driving voltage VSS1, a second driving voltage VSS2, and a third driving voltage VSS3, (hereinafter, respectively referred to as "first, second, and third ground voltages VSS1, VSS2, and VSS3,"), which are utilized for an operation of the gate driving circuit 140. For example, the first ground voltage, the second ground voltage, and the third ground voltage may be considered a point of reference potential (e.g., ground). In at least one embodiment of the inventive concept, one or more ground voltages may be used to discharge at least one circuit. The voltage generation circuit 130 may further generate various driving voltages, e.g., an analog power voltage, a common voltage, etc., for an operation of the source driving circuit 150 and the display panel 110. In the present exemplary embodiment of the inventive concept, the voltage generation circuit 130 generates two clock signals CKV and CKVB and the first, second, and third ground voltages VSS1, VSS2, and VSS3, but the number of the clock signals and the number of the ground voltages is not limited thereto or thereby.

In the present exemplary embodiment of the inventive concept, the voltage generation circuit 130 may set a voltage level of the third ground voltage VSS3 that is based on a first voltage signal VQ1 (FIG. 1) from the gate driving circuit 140. The voltage generation circuit 130 may set the voltage level of the third ground voltage VSS3 based on a difference value between the first voltage signal VQ1 and a reference voltage. For example, when the difference value between the first voltage signal VQ1 and the reference voltage is less than a first reference value, the third ground voltage VSS3 is generated at a first level, and when the difference value between the first voltage signal VQ1 and the reference voltage is greater than the first reference value and less than a second reference value, the third ground voltage VSS3 is generated at a second level less than the first level. A configuration and an operation of the voltage generation circuit 130 will be described in more detail hereinafter.

Figure 3:
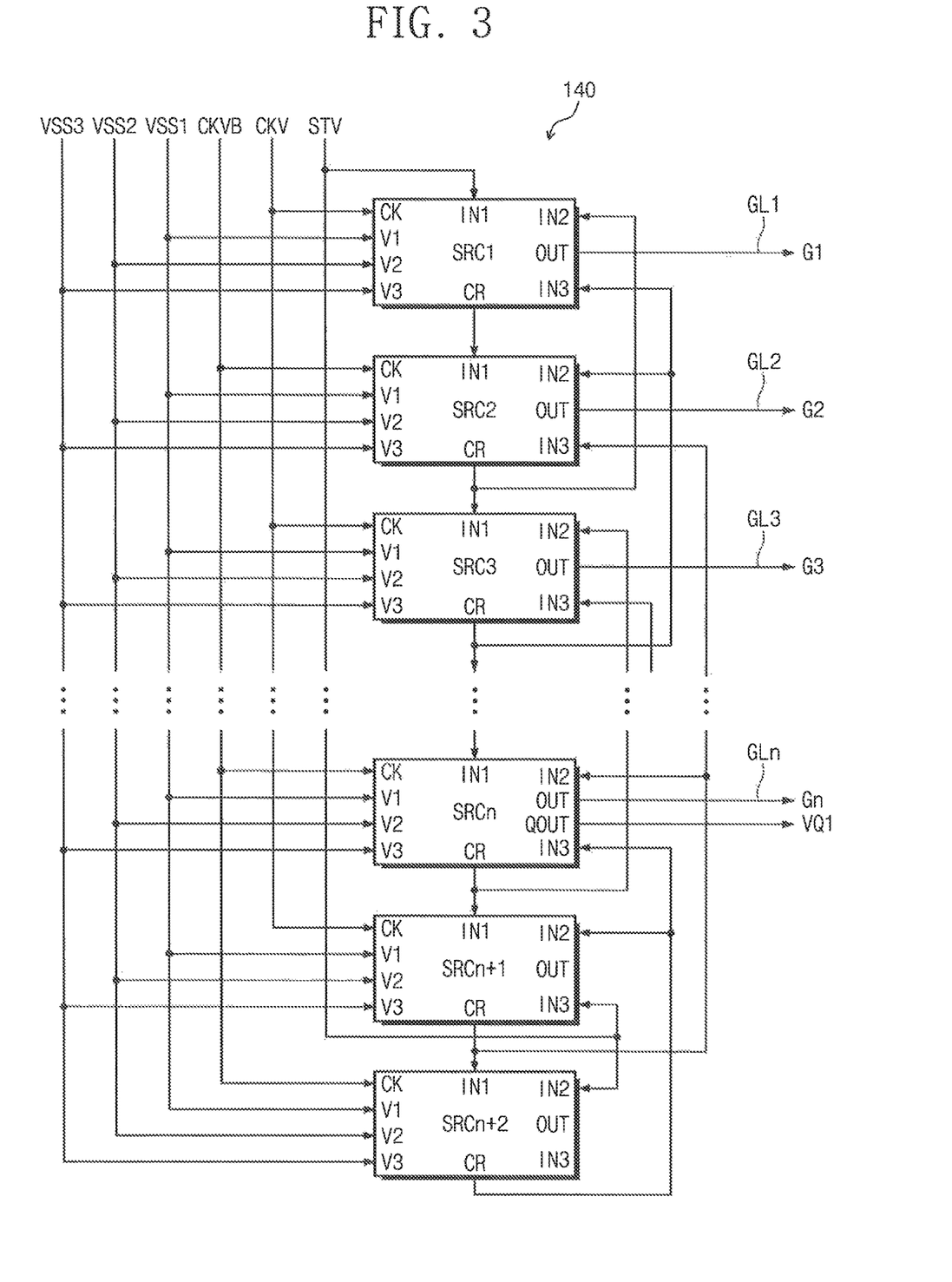
FIG. 3 is a block diagram showing a gate driving circuit according to an exemplary embodiment of the inventive concept.

FIG. 3 is a block diagram showing the gate driving circuit 140 according to an exemplary embodiment of the inventive concept.

Referring to FIG. 3, the gate driving circuit 140 may include a plurality of driving stages SRC1 to SRCn and dummy driving stages SRCn+1 and SRCn+2. The driving stages SRC1 to SRCn and the dummy driving stages SRCn+1 and SRCn+2 are connected to each other in sequence where each driving stage may be driven in response to a carry signal output from a previous driving stage and a carry signal output from a subsequent driving stage.

Each of the driving stages SRC1 to SRCn receives a clock signal (e.g., the first clock signal CKV or the second clock signal CKVB), the first ground voltage VSS1, the second ground voltage VSS2, and the third ground voltage VSS3 from the voltage generation circuit 130 (FIG. 1). The first ground voltage VSS1, the second ground voltage VSS2, and the third ground voltage VSS3 (as discussed above) may also be referred to as respective driving voltages). The driving stage SRC1 and the dummy driving stages SRCn+1 and SRCn+2 further receive the start signal STV.

In this exemplary embodiment of the inventive concept, the driving stages SRC1 to SRCn are connected to the gate lines GL1 to GLn, respectively. The driving stages SRC1 to SRCn apply the gate signals to the gate lines GL1 to GLn, respectively. In this exemplary embodiment of the inventive concept, the gate lines connected to the driving stages SRC1 to SRCn may be odd-numbered gate lines or even-numbered gate lines among the gate lines GL1 to GLn.

Each of the driving stages SRC1 to SRCn and the dummy driving stages SRCn+1 and SRCn+2 includes, for example, three input terminals IN1, IN2, and IN3, an output terminal OUT, a carry terminal CR, a clock terminal CK, a first voltage terminal V1, and a second voltage terminal V2. A person of ordinary skill in the art should understand and appreciate that embodiments of the inventive concept are not limited to a particular number of driving stages, input terminals, etc. The output terminal OUT of each of the driving stages SRC1 to SRCn is connected to a corresponding gate line of the gate lines GL1 to GLn. The gate signals GS1 to GSn generated by the driving stages SRC1 to SRCn are applied to the gate lines GL1 to GLn through the output terminals OUT. In SRCn+1 and SRCn+2 do not have an output terminal OUT connected to a corresponding gate line in FIG. 3.

The carry terminal CR of each of the driving stages SRC1 to SRCn is electrically connected to a first input terminal IN1 of the next driving stage after a corresponding driving stage. In addition, the carry terminal CR of each of the driving stages SRC2 to SRCn is connected to the previous driving stage. For example, FIG. 3 illustrates a carry terminal CR of a k-th driving stage SRCk ("k" is a natural number greater than 2) among the driving stages SRC1 to SRCn is connected to a second input terminal IN2 of a (k−1)th driving stage and a third input terminal IN3 of a (k−2)th driving stage. The carry terminal CR of each of the driving stages SRC1 to SRCn and the dummy driving stages SRCn+1 and SRCn+2 outputs the carry signal.

The first input terminal IN1 of each of the driving stages SRC2 to SRCn and the dummy driving stages SRCn+1 and SRCn+2 receives the carry signal from the previous driving stage prior to the corresponding driving stage. For instance, the first input terminal IN1 of the k-th driving stage SRCk receives the carry signal output from the (k−1)th driving stage SRCk−1. Among the driving stages SRC1 to SRCn, the first input terminal IN1 of the first driving stage SRC1 receives the start signal STV that begins an operation of the gate driving circuit 140 because there is not a carry signal from a previous driving stage.

The second input terminal IN2 of each of the driving stages SRC1 to SRCn receives the carry signal from the carry terminal CR of the next driving stage after the corresponding driving stage. The third input terminal IN3 of each of the driving stages SRC1 to SRCn receives the carry signal from a driving stage following the next driving stage after the corresponding driving stage. For example, the second input terminal IN2 of the k-th driving stage SRCk receives the carry signal output from the carry terminal CR of a (k+1)th driving stage SRCk+1. The third input terminal IN3 of the k-th driving stage SRCk receives the carry signal output from the carry terminal CR of a (k+2)th driving stage SRCk+2. According to another exemplary embodiment of the inventive concept, the second input terminal IN2 of each of the driving stages SRC1 to SRCn may be electrically connected to the output via the terminal OUT of the next driving stage of the corresponding driving stage. In addition, the third input terminal IN3 of each of the driving stages SRC1 to SRCn may be electrically connected to the output terminal OUT of the driving stage following the next driving stage of the corresponding driving stage.

The second input terminal IN2 of the last driving stage SRCn receives the carry signal output from the carry terminal CR of the dummy driving stage SRCn+1. The third input terminal IN3 of the last driving sage SRCn receives the carry signal output from the carry terminal CR of the dummy driving stage SRCn+2.

In the present exemplary embodiment of the inventive concept, the last driving stage SRCn further includes a voltage output terminal QOUT to output the first voltage signal VQ1.

The clock terminal CK of each of the driving stages SRC1 to SRCn receives one of the first clock signal CKV and the second clock signal CKVB. For example, the clock terminals CK of the odd-numbered driving stages SRC1, SRC3, . . . , SRCn−1 from among the driving stages SRC1 to SRCn may receive the first clock signal CKV. The clock terminals CK of even-numbered driving stages SRC2, SRC4, . . . , SRCn from among the driving stages SRC1 to SRCn may receive the second clock signal CKVB. The first and second clock signals CKV and CKVB have different phases from each other.

With continued reference to FIG. 3, the first voltage terminal V1 of each of the driving stages SRC1 to SRCn receives the first ground voltage VSS1. The second voltage terminal V2 of each of the driving stages SRC1 to SRCn receives the second ground voltage VSS2. The third voltage terminal V3 of each of the driving stages SRC1 to SRCn receives the third ground voltage VSS3. The first and second ground voltages VSS1 and VSS2 have different voltage levels from each other. In the present exemplary embodiment of the inventive concept, the second ground voltage VSS2 has a voltage level less than that of the first ground voltage VSS1. In the present exemplary embodiment of the inventive concept, the third ground voltage VSS3 has a voltage level equal to or less than that of the second ground voltage VSS2.

In each of the driving stages SRC1 to SRCn according to the present exemplary embodiment of the inventive concept, a person of ordinary skill in the art should understand and appreciate that the driving stages are not limited to the structure shown and described herein. For example, one of the output terminal OUT, the first input terminal IN1, the second input terminal IN2, the third input terminal IN3, the carry terminal CR, the clock terminal CK, the first voltage terminal V1, and the second voltage terminal V2 may be omitted, or another terminal may be added to each of the driving stages SRC to SRCn. For instance, one of the first and second voltage terminals V1 and V2 may be omitted. In such constructions, each of the driving stages SRC1 to SRCn may receive only one of the first ground voltage VSS1 and the second ground voltage VSS2. In addition, a connection relationship between the driving stages SRC1 to SRCn may be different than shown and described herein.

Figure 4:
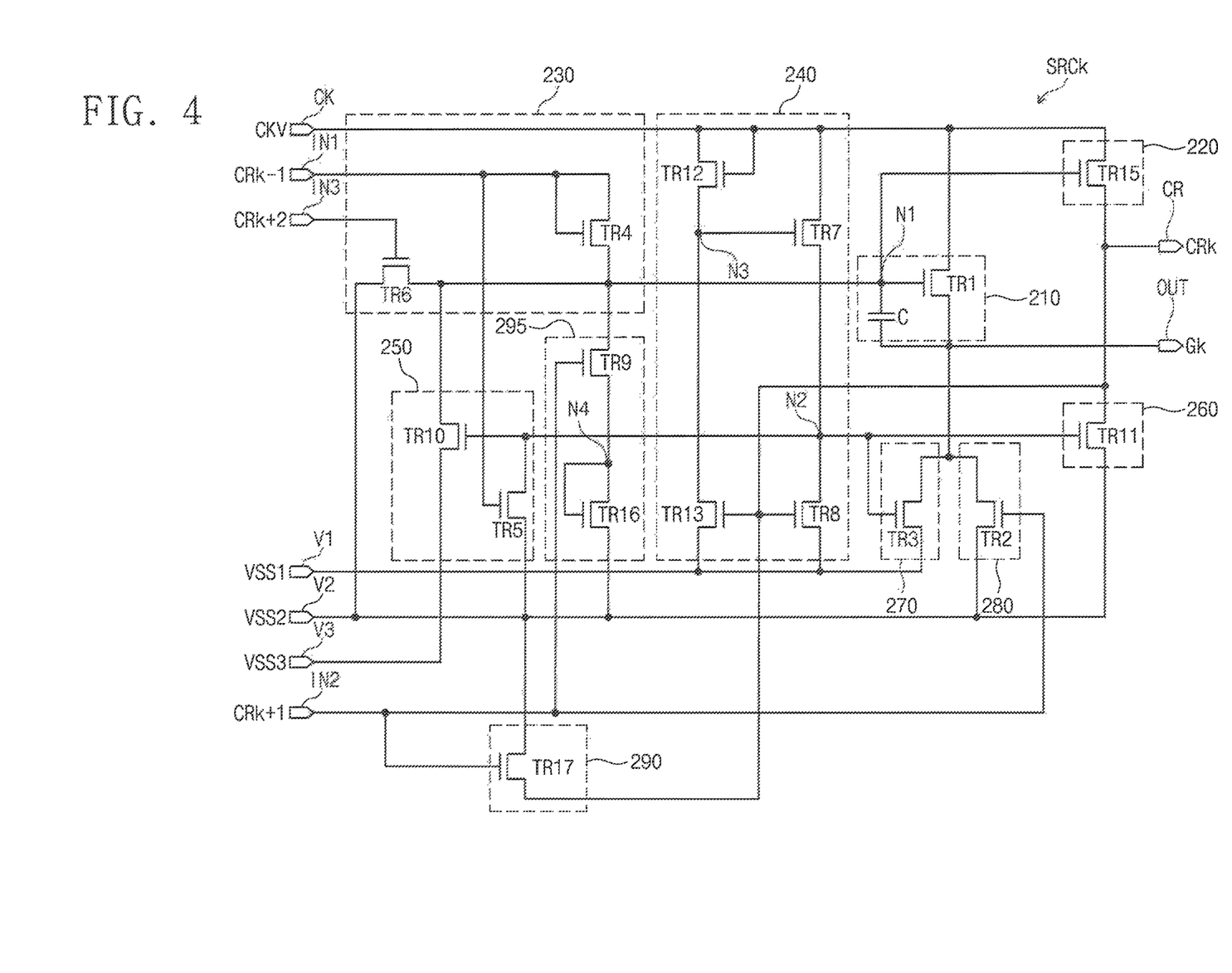
FIG. 4 is a circuit diagram showing a k-th driving stage according to an exemplary embodiment of the inventive concept.

FIG. 4 is a circuit diagram showing a driving stage according to an exemplary embodiment of the inventive concept.

FIG. 4 shows the k-th driving stage SRCk ("k" is a natural number) among the driving stages SRC1 to SRCn−1 shown in FIG. 3 as a non-limiting representative example. Each of the driving stages SRC1 to SRCn−1 shown in FIG. 3 may have the same circuit configuration, or a similar circuit configuration, as that of the k-th driving stage SRCk.

Referring to FIG. 4, the k-th driving stage SRCk includes a first output circuit 210, a second output circuit 220, a control circuit 230, a discharge hold circuit 240, a first discharge circuit 250, a second discharge circuit 260, a third discharge circuit 270, a first pull-down circuit 280, a second pull-down circuit 290, and a third pull-down circuit 295.

The first output circuit 210 outputs a k-th gate signal Gk, and the second output circuit 220 outputs a k-th carry signal CRk. The first pull-down circuit 280 pulls down the output terminal OUT to the second ground voltage VSS2 connected to the second ground terminal V2, and the second pull-down circuit 290 pulls down the carry terminal CR to the second ground voltage VSS2 connected to the second ground terminal V2. The control circuit 230 controls an operation of the first output circuit 210 and the second output circuit 220.

The circuit configuration of the k-th driving stage SRCk is described hereinbelow.

The first output circuit 210 includes a first output transistor TR1 and a capacitor C. The first output transistor TR1 includes a first electrode connected to the clock terminal CK, a control electrode connected to a first node N1, and a second electrode outputting the k-th gate signal Gk.

The second output circuit 220 includes a second output transistor TR15. The second output transistor TR15 includes a first electrode connected to the clock terminal CK, a control electrode connected to the first node N1, and a second electrode outputting the k-th carry signal CRk.

As shown in FIG. 3, the clock terminals CK of the driving stages SRC1, SRC3, . . . , SRCn−1 from among the driving stages SRC1 to SRCn−1 and the dummy driving stage SRCn+1 receive the first clock signal CKV. The clock terminals CK of the driving stages SRC2, SRC4, . . . , SRCn−2 among the driving stages SRC1 to SRCn−1 and the dummy driving stage SRCn+2 receive the second clock signal CKVB. The first clock signal CKV and the second clock signal CKVB are signals complementary to each other. For example, the first clock signal CKV and the second clock signal CKVB have a phase difference of about 180 degrees.

With reference to FIG. 4, the control circuit 230 turns on the first and second output transistors TR1 and TR15 in response to receiving a previous carry signal, e.g., a (k−1)th carry signal CRk−1 output from the previous driving stage SRCk−1 and applied to the first input terminal IN1 of the control circuit 230. The control circuit 230 turns off the first and second output transistors TR1 and TR15 in response to a (k+2)th carry signal CRk+2 output from the driving stage SRCk+2 following the next driving stage and applied to the third input terminal IN3.

The control circuit 230 includes fourth and sixth transistors TR4 and TR6. The fourth transistor TR4 includes a first electrode connected the first input terminal IN1, a second electrode connected to the first node N1, and a control electrode connected to the first input terminal IN1. The sixth transistor TR6 includes a first electrode connected to the first node N1, a second electrode connected to the second voltage terminal V2, and a control electrode connected to the third input terminal IN3.

With reference to FIG. 4, the discharge hold circuit 240 applies the first clock signal CKV received from the clock terminal CK to the second node N2. The discharge hold circuit 240 includes seventh, eighth, twelfth, and thirteenth transistors TR7, TR8, TR12, and TR13. The seventh transistor TR7 includes a first electrode connected to the clock terminal CK, a second electrode connected to the second node N2, and a control electrode connected to a third node N3. The twelfth transistor TR12 includes a first electrode connected to the clock terminal CK, a second electrode connected to the third node N3, and a control electrode connected to the clock terminal CK. The eighth transistor TR8 includes a first electrode connected to the second node N2, a second electrode connected to the first voltage terminal V1, and a control electrode connected to the carry terminal CR. The thirteenth transistor TR13 includes a first electrode connected to the third node N3, a second electrode connected to the first voltage terminal V1, and a control electrode connected to the carry terminal CR.

As also shown in FIG. 4, the first discharge circuit 250 discharges the second node N2 to the second ground voltage VSS2 in response to the (k−1)th carry signal CRk−1 and discharges the first node N1 to the second ground voltage VSS2 in response to a signal of the second node N2. The first discharge circuit 250 includes a fifth transistor TR5 and a tenth transistor TR10. The fifth transistor TR5 includes a first electrode connected to the second node N2, a second electrode connected to the second voltage terminal V2, and a control electrode connected to the first input terminal IN1. The tenth transistor TR10 includes a first electrode connected to the first node N1, a second electrode connected to the third voltage terminal V3, and a control electrode connected to the second node N2.

The second discharge circuit 260 discharges the carry terminal CR to the second ground voltage VSS2 in response to a signal of the second node N2. The second discharge circuit 260 includes an eleventh transistor TR11 including a first electrode connected to the carry terminal CR, a second electrode connected to the second voltage terminal V2, and a control electrode connected to the second node N2.

The third discharge circuit 270 discharges the output terminal OUT to the first ground voltage VSS1 in response to a signal of the second node N2. The third discharge circuit 270 includes a third transistor TR3 including a first electrode connected to the output terminal OUT, a second electrode connected to the first voltage terminal V1, and a control electrode connected to the second node N2.

The first pull-down circuit 280 discharges the output terminal OUT to the second ground voltage VSS2 in response to the (k+1)th carry signal CRk+1 provided through the second input terminal IN2. As shown in FIG. 4, the first pull-down circuit 280 includes a second transistor TR2 including a first electrode connected to the output terminal OUT, a second electrode connected to the second voltage terminal V2, and a control electrode connected to the second input terminal IN2.

The second pull-down circuit 290 discharges the carry terminal CR to the second ground voltage VSS2 in response to the (k+1)th carry signal CRk+1 provided through the second input terminal IN2. The second pull-down circuit 290 includes a seventeenth transistor TR17 including a first electrode connected to the carry terminal CR, a second electrode connected to the second voltage terminal V2, and a control electrode connected to the second input terminal IN2.

The third pull-down circuit 295 discharges the first node N1 to the second ground voltage VSS2 in response to the (k+1)th carry signal CRk+1. The third pull-down circuit 295 includes a ninth transistor TR9 and a sixteenth transistor TR16. The ninth transistor TR9 includes a first electrode connected to the first node N1, a second electrode connected to a fourth node N4, and a control electrode connected to the second input terminal IN2. The sixteenth transistor TR16 includes a first electrode connected to the fourth node N4, a second electrode connected to the second voltage terminal V2, and a control electrode connected to the fourth node N4.

Figure 5:
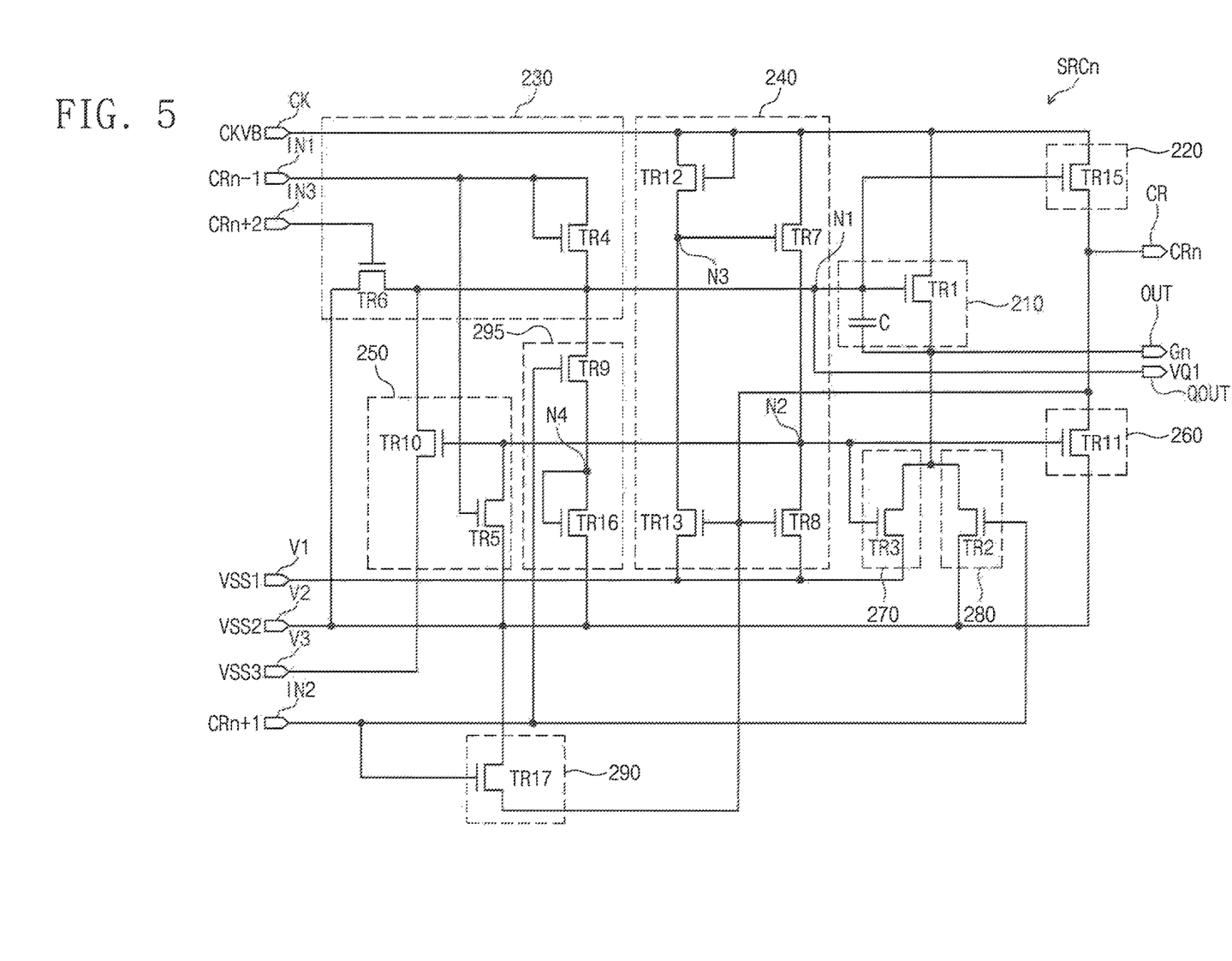
FIG. 5 is a circuit diagram showing an n-th driving stage according to an exemplary embodiment of the inventive concept.

FIG. 5 is a circuit diagram showing the n-th driving stage SRCn according to an exemplary embodiment of the inventive concept.

FIG. 5 shows the last driving stage among the driving stages SRC1 to SRCn, e.g., the n-th ("n" is a natural number) driving stage SRCn. The n-th driving stage SRCn has a configuration similar to that of the k-th driving stage SRCk shown in FIG. 4. In FIG. 5, the same reference numerals denote the same elements in FIG. 4, and thus detailed descriptions of the same elements will be omitted to avoid redundancy.

Referring to FIG. 5, the first output circuit 210 has a different construction than shown in FIG. 5. For example, a signal of the first node N1 is output through the voltage output terminal QOUT as the first voltage signal VQ1.

Figure 6:
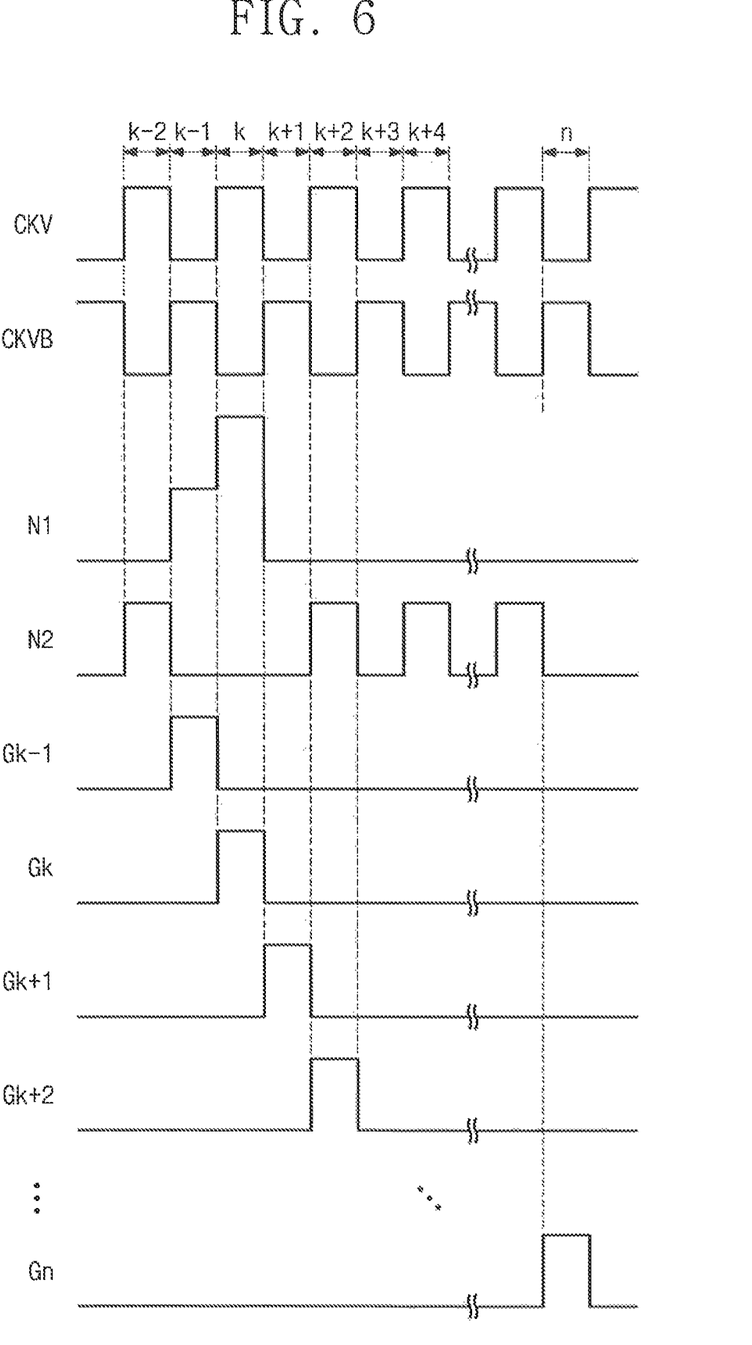
FIG. 6 is a timing diagram showing an exemplary operation of a driving stage.

FIG. 6 is a timing diagram showing an operation of the k-th driving stage shown in FIG. 4 and a k-th ripple discharge circuit shown in FIG. 5.

Referring to FIGS. 4 to 6, the first clock signal CKV and the second clock signal CKVB have the same frequency as each other and different phases from each other. In the present exemplary embodiment of the inventive concept, the first clock signal CKV and the second clock signal CKVB are complementary signals to each other.

When the (k−1)th carry signal CRk−1 is transited to the high level in a (k−1)th clock period k−1, the fourth transistor TR4 is turned on, and the voltage level of the first node N1 rises. When the first clock signal CKV is transited to the high level in a k-th clock period "k", the first output transistor TR1 is turned on, and the voltage of the first node N1 is boosted by the capacitor C. In this case, the k-th gate signal Gk is output through the output terminal OUT. When the second output transistor TR15 is turned by the boosted voltage of the first node N1, the k-th carry signal CRk is output through the carry terminal CR.

When the first clock signal CKV is transited to the low level in a (k+1)th clock period k+1, the first output transistor TR1 and the second output transistor TR15 are turned off.

Then, when the (k+1)th carry signal CRk−1 is transited to the high level, the second transistor TR2 of the first pull-down circuit 280 is turned on, and the k-th gate signal Gk output through the output terminal OUT is discharged to the second ground voltage VSS2. When the seventeenth transistor T17 of the second pull-down circuit 290 is turned on in response to the (k+1)th carry signal CRk+1 at the high level, the k-th gate signal Gk output through the output terminal OUT is discharged to the second ground voltage VSS2. When the ninth transistor TR9 and the sixteenth transistor T16 are turned on in response to the (k+1)th carry signal CRk+1 at the high level, the first node N1 is discharged to the second ground voltage VSS2.

Then, when a (k+2)th gate signal Gk+2 is transited to the high level in a (k+2)th clock period k+2, the sixth transistor TR6 is turned on, and thus the first node N1 is maintained in the second ground voltage VSS2.

Meanwhile, when the first clock signal CKV has the high level in the (k+2)th clock period k+2, the second node N2 is transited to the high level. When the second node N2 is transited to the high level, the third transistor TR3 is turned on, and thus the output terminal OUT is maintained in the first ground voltage VSS1. Similarly, when the second node N2 is transited to the high level, the eleventh transistor TR11 is turned on, and thus the output terminal OUT is maintained in the second ground voltage VSS2. Since the second node N2 is transited to the high level, the tenth transistor TR10 is turned on, and thus the first node N1 is discharged to the third ground voltage VSS3.

The gate signals G1 to Gn are maintained at a lower level than a predetermined level in a period, in which the gate signals G1 to Gn are maintained in the gate-off voltage level (e.g., the first ground voltage VSS1 in the present exemplary embodiment), except for a period in which the gate signals G1 to Gn are maintained in a gate-on voltage level. The pixels PX shown in FIG. 1 may be prevented from malfunctioning when the gate signals G1 to Gn are maintained in the gate-off voltage level.

With reference to FIGS. 4 and 5, when the transistors TR1 to TR17 shown are operated for a long time at a high temperature, a threshold voltage of the transistors TR1 to TR17 may vary. When the threshold voltage of the transistors TR1 to TR17 varies, the transistors TR1 to TR17 may be turned on weakly (e.g. slightly turned on because of a threshold voltage variance), and thus the weakly turned-on transistors TR1 to TR17 may cause the voltage level of the gate signals G1 to Gn to rise.

In the case where the first node N1 is connected to the gate electrodes of the first output transistor TR1 and the second output transistor TR15, if the voltage level of the first node N1 abnormally rises, the first output transistor TR1 and the second output transistor TR15 are turned on. By turning on the first output transistor TR1 and second output transistor TR15, the voltage level of the gate signals G1 to Gn may rise.

In the present exemplary embodiment of the inventive concept, the signal of the first node N1 of the n-th driving stage SRCn is provided to the voltage generation circuit 130 shown in FIG. 1 as the first voltage signal VQ1. The voltage generation circuit 130 sets the level of the third ground voltage VSS3 depending on the voltage level of the first voltage signal VQ1. As can be seen in FIGS. 4 and 5, VSS3 can be used to control the gate voltages of TR1 and TR15. Based on the level of VQ1, the voltage generation circuit 130 shown in FIG. 1 can adjust the gate voltages in response to the rise in VQ1. More particularly, the first node N1 may be discharged via the third ground voltage VSS3 to reduce the gate voltage provided to TR1 and TR15.

For example, in a case that the signal of the first node N1, e.g., the first voltage signal VQ1, abnormally rises, the voltage level of the third ground voltage VSS3 may be set to a level lower than the second ground voltage VSS2.

Referring to FIGS. 4 to 6 again, in each of the (k+2)th and (k+4)th clock periods k+2 and k+4, each in which the first clock signal CKV is at the high level, the twelfth transistor TR12 and the seventh transistor TR7 of the discharge hold circuit 240 are turned on, and the thirteenth transistor TR13 and the eighth transistor TR8 are turned off. Accordingly, since the voltage level of the second node N2 rises to the high level of the first clock signal CKV, the tenth transistor TR10 of the first discharge circuit 250 may be turned on. In this case, since the voltage level of the third ground voltage VSS3 is set to a level lower than the second ground voltage VSS2, the signal of the first node N1 may be sufficiently discharged to the low voltage level.

In the present exemplary embodiment of the inventive concept, the voltage generation circuit 130 shown in FIG. 1 receives the first voltage signal VQ1 corresponding to the signal of the first node N1 of the n-th driving stage SRCn, but the voltage generation circuit 130 may receive the signal of the first node N1 of one driving stage among the driving stages SRC1 to SRCn-1. According to another exemplary embodiment of the inventive concept, the voltage generation circuit 130 may receive signals of the first node N1 of two or more driving stages among the driving stages SRC1 to SRCn-1.

As described hereinabove with reference to FIGS. 3 to 5, the driving stages SRC1 to SRCn are connected to each other one after another to facilitate each driving stage to be driven in response to the carry signal output from the previous driving stage. As an example, the k-th driving stage SRCk is influenced by the operating result (e.g., the previous carry signals) of the driving stages SRC1 to SRCk-1. Therefore, the voltage level of the third ground voltage VSS3 is set based on the first voltage signal VQ1 corresponding to the signal of the first node N1 of the n-th driving stage SRCn that is the last driving stage.

Figure 7:
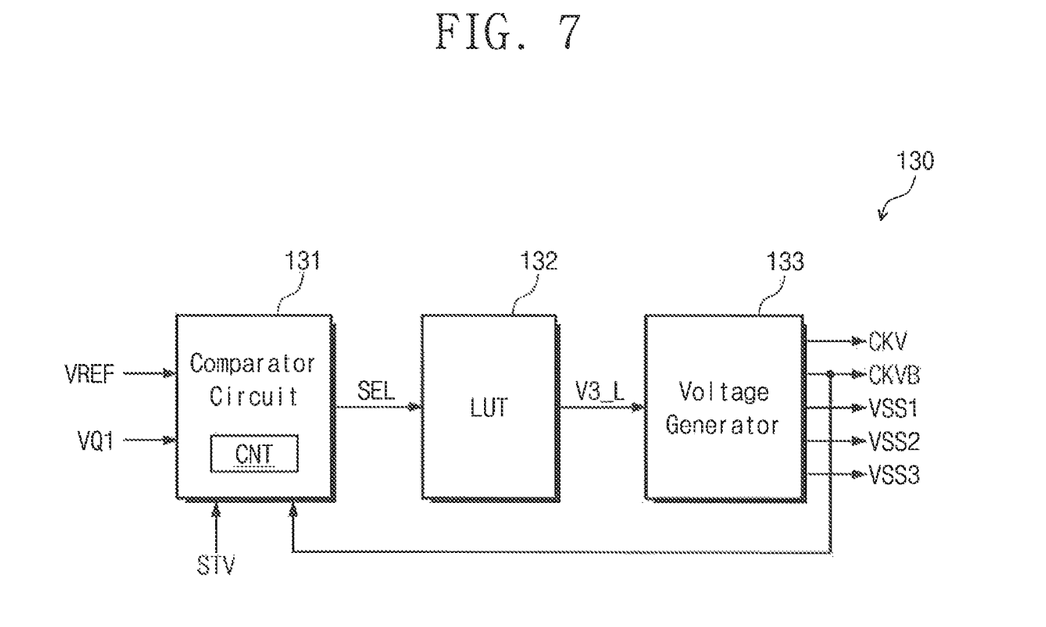
FIG. 7 is a block diagram showing a voltage generation circuit according to an exemplary embodiment of the inventive concept.

FIG. 7 is a block diagram showing the voltage generation circuit 130 according to an exemplary embodiment of the inventive concept.

Referring to FIG. 7, the voltage generation circuit 130 includes a comparator circuit 131, a look-up table 132, and a voltage generator 133.

The comparator circuit 131 compares the first voltage signal VQ1 with a reference voltage VREF and outputs a selection signal SEL corresponding to a difference value between the first voltage signal VQ1 and the reference voltage VREF. The look-up table 132 outputs a voltage level signal V3_L corresponding to the selection signal SEL. The look-up table 132 may include, for example, a memory controller and an interface (not shown). The memory controller may retrieve the information from the look-up table based on the selection signal SEL and generate the voltage level signal that corresponds to the selection signal SEL. The voltage generator 133 generates the third ground voltage VSS3 corresponding to the voltage level signal V3_L. The voltage generator 133 may further generate the first clock signal CKV, the second clock signal CKVB, the first ground voltage VSS1, and the second ground voltage VSS2, which are utilized for the operation of the gate driving circuit 140 shown in FIG. 1, in addition to the third ground voltage VSS3.

Figure 8:
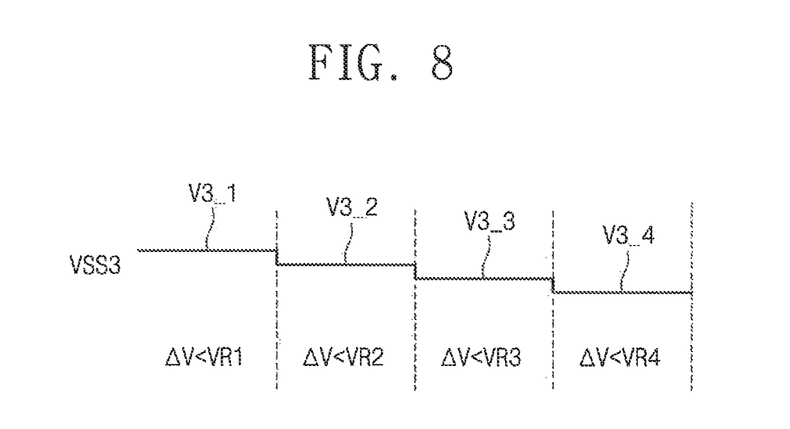
FIG. 8 is a view showing an example of a level of a third ground voltage generated by a voltage generation circuit.

FIG. 8 is a view showing a level of the third ground voltage generated by the voltage generation circuit 130. It can be seen in FIG. 8 that there are four levels of ground voltage for VSS3 shown and described hereinbelow. However, a person of ordinary skill in the art can understand and appreciate that there can be more levels or less levels of ground voltage for VSS3.

Referring now to FIGS. 7 and 8, when the difference value $\Delta V$ between the first voltage signal VQ1 and the reference voltage VREF is less than a first reference value VR1, the comparator circuit 131 outputs the selection signal SEL to select the third ground voltage VSS3 having a first level V3_1. As discussed herein, the selection signal SEL may cause a memory controller/interface of the look-up table 132 to output the third ground voltage VSS3 having the first level V3_1.

When the difference value $\Delta V$ between the first voltage signal VQ1 and the reference voltage VREF is greater than the first reference value VR1 and less than a second reference value VR2, the comparator circuit 131 outputs the selection signal SEL to select the third ground voltage VSS3 having a second level V3_2.

With continued reference to FIG. 8, when the difference value $\Delta V$ between the first voltage signal VQ1 and the reference voltage VREF is greater than the second reference value VR2 and less than a third reference value VR3, the comparator circuit 131 outputs the selection signal SEL to select the third ground voltage VSS3 having a third level V3_3.

When the difference value $\Delta V$ between the first voltage signal VQ1 and the reference voltage VREF is greater than the third reference value VR3 and less than a fourth reference value VR4, the comparator circuit 131 outputs the selection signal SEL to select the third ground voltage VSS3 having a fourth level V3_4.

In the present exemplary embodiment of the inventive concept, the first, second, third, and fourth reference values VR1, VR2, VR3, and VR4 satisfies the following relation; the first reference value VR1<the second reference value VR2<the third reference value VR3<the fourth reference value VR4. In addition, the voltage levels of the third ground voltage VSS3 satisfies the following relation; the first level V3_1>the second level V3_2>the third level V3_3>the fourth level V3_4. For example, as the difference value between the first voltage signal VQ1 and the reference voltage VREF increases, the voltage level of the third ground voltage VSS3 decreases.

When the signal of the first node N1 of the n-th driving stage SRCn shown in FIG. 5, e.g., the first voltage signal VQ1, rises (e.g. abnormally rises), the voltage generation circuit 130 generates the third ground voltage VSS3 having the voltage level corresponding to the difference value between the first voltage signal VQ1 and the reference voltage VREF.

The first node N1 may be discharged to the third ground voltage VSS3 by the tenth transistor TR10 of the driving stages SRC1 to SRCn shown in FIGS. 3 to 5.

Referring again to FIG. 7, the comparator circuit 131 further receives the vertical start signal STV from the timing controller 120 shown in FIG. 1 and the second clock signal CKVB from the voltage generator 133. The comparator circuit 131 includes a counter CNT. The counter CNT is reset in response to the vertical start signal STV and performs a count-up operation in synchronization with the second clock signal CKVB. The comparator circuit 131 does not compare the first voltage signal VQ1 with the reference voltage VREF and does not output the selection signal SEL when a value counted by the counter CNT is a predetermined value, e.g., n/2. As shown in the timing diagram of FIG. 6, this is because the n-th gate signal Gn may be normally output at the high level when the signal of the first node N1 in the n-th clock period "n", e.g., the first voltage signal VQ1, rises to the high level. According to another exemplary embodiment of the inventive concept, in a case that the comparator circuit 131 receives the first voltage signal VQ1 from the k-th driving sage SRCk shown in FIG. 4, the comparator circuit 131 may receive the first clock signal CKV instead of the second clock signal CKVB. If the "k" is an odd number, the counter CNT of the comparator circuit 131 does not compare the first voltage signal VQ1 with the reference voltage VREF and does not output the selection signal SEL when the counted value is equal to "ij k/2+1 ij".

Figure 9:
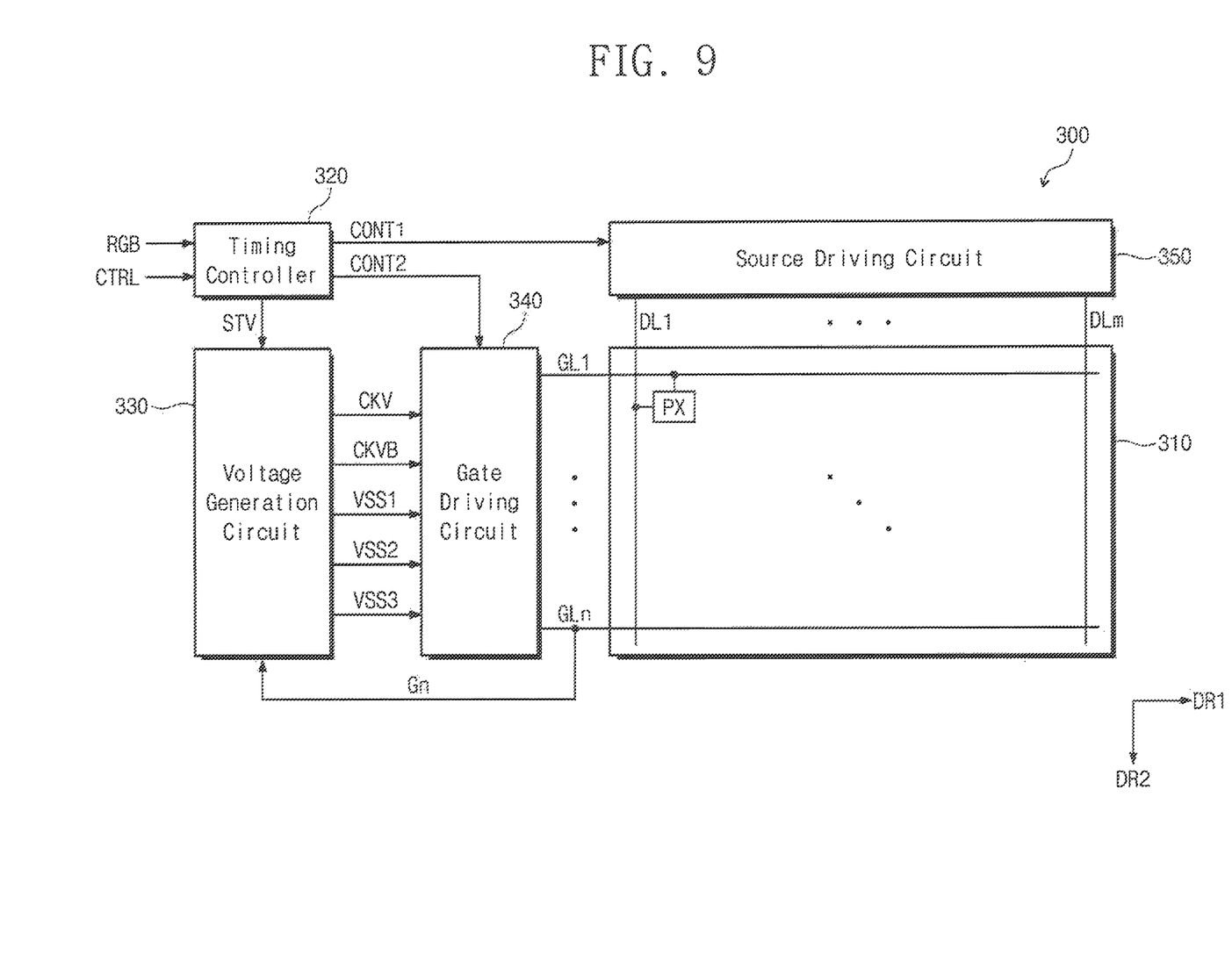
FIG. 9 is a block diagram showing a display device according to another exemplary embodiment of the inventive concept.

FIG. 9 is a block diagram showing a display device 300 according to another exemplary embodiment of the inventive concept.

The display device 300 shown in FIG. 9 includes a display panel 310, a timing controller 320, a voltage generation circuit 330, a gate driving circuit 340, and a source driving circuit 350. The display device 300 shown in FIG. 9 has the similar configuration as the display device 100 shown in FIG. 1, and thus details thereof will be omitted to avoid redundancy.

The voltage generation circuit 130 shown in FIG. 1 receives the first voltage signal VQ1 from the gate driving circuit 140, but the voltage generation circuit 330 shown in FIG. 9 receives an n-th gate signal Gn applied to an n-th gate line GLn.

The gate driving circuit 340 may have the same circuit configuration as the driving stages SRC1 to SRCn shown in FIG. 3. However, an n-th driving stage of the gate driving circuit 340 may have the same circuit configuration as other driving stages SRC1 to SRCn-1.

The voltage generation circuit 330 may set a voltage level of the third ground voltage VSS3 based on the n-th gate signal Gn. The voltage generation circuit 330 may set the voltage level of the third ground voltage VSS3 based on a difference value between the n-th gate signal Gn and a reference voltage. For example, when the difference value between the n-th gate signal Gn and the reference voltage is less than a first reference value, the voltage generation circuit 330 generates the third ground voltage VSS3 having a first level, and when the difference value between the n-th gate signal Gn and the reference voltage is greater than the first reference value and less than a second reference value, the voltage generation circuit 330 generates the third ground voltage VSS3 having a second level less than the first level.

According to an embodiment of the inventive concept, when the voltage level of the n-th gate signal Gn abnormally rises, the voltage generation circuit 330 may set the voltage level of the third ground voltage VSS3 to a level less than a second ground voltage VSS2. The first node N1 of the driving stage SRCk shown in FIG. 4 may be discharged to the third ground voltage VSS3 less than the second ground voltage VSS2. As described above, since the voltage of the first node N1 is stabilized, the reliability of the gate driving circuit 340 may be increased. In addition, the display device may have increased reliability when being operated at relatively high temperatures, as the display device may not be affected by transistors with respectively different threshold capability causing them to turn on and impact a gate signal of, for example, output transistors.

Although the exemplary embodiments of the inventive concept have been described, it is understood that the scope of the inventive concept is not be limited to these exemplary embodiments. Various changes and modifications can be made by a person of ordinary skill in the art within the spirit and scope of the inventive concept as hereinafter claimed.

What is claimed is:

1. A display device comprising:
    a display panel comprising a plurality of gate lines, a plurality of data lines, and a plurality of pixels each being connected to a corresponding gate line among the gate lines and a corresponding data line among the data lines;
    a voltage generation circuit that generates voltages including a plurality of clock signals and a first driving voltage, a second driving voltage, and a third driving voltage;
    a gate driving circuit that receives the clock signals and the first driving voltage, second driving voltage, and third driving voltage and comprising a plurality of driving stages each of which outputs a carry signal and a gate signal to a corresponding gate line among the gate lines; and
    a data driving circuit that drives the data lines, a k-th (k is a natural number) driving stage among the plurality of driving stages including:
        a control circuit that applies a previous carry signal to a first node of one of the plurality of driving stages in response to a previous carry signal output from a previous driving stage;
        an output circuit that outputs a first clock signal among the clock signals as a k-th gate signal and a k-th carry signal in response to a signal of the first node;
        a discharge hold circuit that applies one of the first clock signal and the first driving voltage to a second node in response to the first clock signal and the k-th carry signal; and
        a first discharge circuit that discharges the first node to the third driving voltage in response to a signal of the second node and to discharge the second node to the second driving voltage in response to the previous carry signal, wherein the voltage generation circuit sets a voltage level of the third driving voltage based on the signal of the first node of at least one of the plurality of driving stages.

2. The display device of claim 1, wherein the voltage generation circuit generates the third driving voltage based on a difference value between the signal of the first node, which is provided from the gate driving circuit, and a reference voltage.

3. The display device of claim 2, wherein the voltage generation circuit generates the third driving voltage having a first level when the difference value is less than a first reference value and generates the third driving voltage having a second level less than the first level when the difference value is greater than the first reference value and less than a second reference value.

4. The display device of claim 1, wherein the voltage generation circuit comprises:
    a comparator circuit that compares the signal of the first node with a reference voltage to output a selection signal corresponding to a difference value between the signal of the first node and the reference voltage;
    a look-up table that outputs a voltage level signal corresponding to the selection signal; and a voltage generator that generates the third driving voltage corresponding to the voltage level signal.

5. The display device of claim 4, wherein the comparator circuit outputs the selection signal having a first value when the difference value is less than a first reference value and outputs the selection signal having a second value when the difference value is greater than the first reference value and less than a second reference value.

6. The display device of claim 5, wherein the look-up table includes a memory interface that outputs the voltage level signal in which the third driving voltage having a first level is output by the voltage generator when the selection signal has the first value and outputs the voltage level signal in which the third driving voltage having a second level is output by the voltage generator when the selection signal has the second value, and the second level of the third driving voltage is less than the first level of the third driving voltage.

7. The display device of claim 4, wherein the voltage generator further generates the first and second driving voltages and the clock signals.

8. The display device of claim 7, wherein the comparator circuit comprises a counter that performs a counting operation in synchronization with a vertical start signal and one of the clock signals, and the comparator circuit does not output the selection signal when a counted value corresponds to a predetermined value.

9. The display device of claim 1, wherein the second driving voltage has a voltage level less than the first driving voltage, and the third driving voltage has a voltage level equal to or less than the second driving voltage.

10. The display device of claim 1, wherein the k-th driving stage comprises:
a second discharge circuit that discharges the k-th carry signal to the second driving voltage in response to the signal of the second node; and
a third discharge circuit that discharges the k-th gate signal to the first driving voltage in response to the signal of the second node.

11. The display device of claim 1, wherein the voltage generation circuit sets the voltage level of the third driving voltage based on the signal of the first node of a last driving stage of the plurality of driving stages.

12. A display device comprising:
a display panel comprising a plurality of gate lines, a plurality of data lines, and a plurality of pixels each being connected to a corresponding gate line among the gate lines and a corresponding data line among the data lines;
a data driving circuit that drives the data lines;
a voltage generation circuit that generates voltages including a plurality of clock signals and at least a first driving voltage, a second driving voltage, and a third driving voltage, each of the at least the first driving voltage, the second driving voltage, and the third driving voltage have different voltage levels from each other, and wherein the third driving voltage controls at least a first output transistor and a second output transistor;
a gate driving circuit that includes a plurality of driving stages each of which outputs a carry signal and a gate signal to a corresponding gate line among the gate lines, receives at least one of the clock signals and the at least the first driving voltage, the second driving voltage, and the third driving voltage, and outputs a first voltage signal to the voltage generation circuit that indicates gate control voltage of at least the first output transistor and the second output transistor;
a discharge circuit that includes a first transistor and a second transistor;
wherein the first transistor discharges a first node to the third driving voltage in response to a signal of a second node;
wherein the second transistor discharges the second node to the second driving voltage in response to a previous carry signal, and
wherein the voltage generation circuit sets a level of the third driving voltage based on the first voltage signal being output from the gate driving circuit, and wherein the level of the third driving voltage is decreased to discharge a gate voltage of at least one or more of the first output transistor and the second output transistor.

* * * * *